US012794430B2

(12) United States Patent
Huang

(10) Patent No.: US 12,794,430 B2
(45) Date of Patent: Nov. 10, 2026

(54) AMPLIFIER CIRCUIT

(71) Applicant: REALTEK SEMICONDUCTOR CORPORATION, Hsinchu (TW)

(72) Inventor: Shih-Hsiung Huang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 392 days.

(21) Appl. No.: 18/623,082

(22) Filed: Apr. 1, 2024

(65) Prior Publication Data

US 2024/0388269 A1 Nov. 21, 2024

(51) Int. Cl.
*H03F 3/45* (2006.01)
*H03G 1/00* (2006.01)

(52) U.S. Cl.
CPC ....... *H03G 1/0029* (2013.01); *H03F 3/45183* (2013.01); *H03F 2203/45512* (2013.01)

(58) Field of Classification Search
CPC .............. H03G 1/0029; H03F 3/45183; H03F 2203/45512
USPC .................................................. 330/252–261
See application file for complete search history.

(56) References Cited

U.S. PATENT DOCUMENTS

2021/0384874 A1* 12/2021 Sun ....................... H03F 1/0227
2023/0040066 A1 2/2023 Huang

OTHER PUBLICATIONS

Yibo Zhao et al., High-performance swing-enhanced floating inverter amplifier using correlated level shifting technique, Apr. 1, 2022, Zhejiang University and College of Information Science and Electronics Engineering.
James Lin et al., A 15.5 dB, Wide Signal Swing, Dynamic Amplifier Using a Common-Mode Voltage Detection Technique, 2011 IEEE. iscas_2011_lin_a15_5dBWideSignalSwingDynamicAmplifierUsingACommonModeVoltageDetectionTechnique.
Md Shakil Akter et al., A Capacitively-Degenerated 100dB Linear 20-150MSs Dynamic Amplifier,2017 JSAP.
Xiyuan Tang et al., An Energy-Efficient Comparator with Dynamic Floating Inverter Pre-Amplifier, 2019_VLSI_Tang, 2019 JSAP.
OA letter of a counterpart TW application (appl. No. 112117973) mailed on Oct. 3, 2023. Summary of the TW OA letter in regard to the TW counterpart application: (1) Claim(s) 1 and 4-8 are rejected under Patent Law Article 22(2) as allegedly being unpatentable over reference 1 (US 2023/0040066 A1). (2) Claims 2-3 and 9-10 are allowed. Claim correspondence between the TW counterpart application and the instant US application: Claims 1-10 in the TW counterpart application correspond to claims 1-10 in the instant US application, respectively.

* cited by examiner

*Primary Examiner* — Hieu P Nguyen
(74) *Attorney, Agent, or Firm* — WPAT, PC

(57) ABSTRACT

An amplifier circuit includes a first dynamic amplifier and a second dynamic amplifier. The first dynamic amplifier amplifies an input voltage to generate an intermediate voltage. The second dynamic amplifier amplifies the intermediate voltage to generate an output voltage. The first dynamic amplifier has a first gain, the second dynamic amplifier has a second gain, and the gain of the amplifier circuit is the product of the first gain and the second gain.

12 Claims, 2 Drawing Sheets

100

AMPLIFIER CIRCUIT

BACKGROUND OF THE INVENTION

1. Field of the Invention

The present invention generally relates to amplifiers, and, more particularly, to dynamic amplifiers.

2. Description of Related Art

Because dynamic amplifiers do not require a current source to provide a fixed direct current (DC) current, there is no consumption of static current. Furthermore, because the current source requires a threshold voltage to conduct, and the process voltage for complementary metal-oxide-semiconductor (CMOS) technology is decreasing, this threshold voltage limits the swing of the amplifier's output signal. Based on the above reasons, amplifiers such as dynamic amplifiers that do not require static current and have relatively large output swings have recently been widely used in circuit systems. Therefore, improving the performance of dynamic amplifiers has become an important issue in this technical field.

SUMMARY OF THE INVENTION

In view of the issues of the prior art, an object of the present invention is to provide an amplifier circuit, so as to make an improvement to the prior art.

According to one aspect of the present invention, an amplifier circuit is provided. The amplifier circuit includes a first input terminal, a second input terminal, a first output terminal, a second output terminal, a first node, a second node, a third node, a fourth node, a fifth node, a sixth node, a seventh node, an eighth node, a ninth node, and a tenth node. The amplifier circuit includes a first dynamic amplifier and a second dynamic amplifier. The first dynamic amplifier includes a first transistor, a second transistor, a third transistor, a fourth transistor, a first capacitor, a first switch, a second switch, a third switch, and a fourth switch. The second dynamic amplifier includes a fifth transistor, a sixth transistor, a seventh transistor, an eighth transistor, a second capacitor, a fifth switch, a sixth switch, a seventh switch, and an eighth switch. The first transistor has a first terminal, a second terminal, and a first control terminal, wherein the first terminal is coupled to the first node, the second terminal is coupled to the sixth node, and the first control terminal is coupled to the first input terminal. The second transistor has a third terminal, a fourth terminal, and a second control terminal, wherein the third terminal is coupled to the second node, the fourth terminal is coupled to the sixth node, and the second control terminal is coupled to the first input terminal. The third transistor has a fifth terminal, a sixth terminal, and a third control terminal, wherein the fifth terminal is coupled to the first node, the sixth terminal is coupled to the fifth node, and the third control terminal is coupled to the second input terminal. The fourth transistor has a seventh terminal, an eighth terminal, and a fourth control terminal, wherein the seventh terminal is coupled to the second node, the eighth terminal is coupled to the fifth node, and the fourth control terminal is coupled to the second input terminal. The first capacitor has a ninth terminal and a tenth terminal, wherein the ninth terminal is coupled to the third node, and the tenth terminal is coupled to the fourth node. The first switch is coupled between the third node and a first reference voltage. The second switch is coupled between the fourth node and a second reference voltage. The third switch is coupled between the first node and the third node. The fourth switch is coupled between the second node and the fourth node. The fifth transistor has an eleventh terminal, a twelfth terminal, and a fifth control terminal, wherein the eleventh terminal is coupled to the seventh node, the twelfth terminal is coupled to the first output terminal, and the fifth control terminal is coupled to the sixth node. The sixth transistor has a thirteenth terminal, a fourteenth terminal, and a sixth control terminal, wherein the thirteenth terminal is coupled to the eighth node, the fourteenth terminal is coupled to the first output terminal, and the sixth control terminal is coupled to the sixth node. The seventh transistor has a fifteenth terminal, a sixteenth terminal, and a seventh control terminal, wherein the fifteenth terminal is coupled to the seventh node, the sixteenth terminal is coupled to the second output terminal, and the seventh control terminal is coupled to the fifth node. The eighth transistor has a seventeenth terminal, an eighteenth terminal, and an eighth control terminal, wherein the seventeenth terminal is coupled to the eighth node, the eighteenth terminal is coupled to the second output terminal, and the eighth control terminal is coupled to the fifth node. The second capacitor has a nineteenth terminal and a twentieth terminal, wherein the nineteenth terminal is coupled to the ninth node, and the twentieth terminal is coupled to the tenth node. The fifth switch is coupled between the ninth node and a third reference voltage. The sixth switch is coupled between the tenth node and a fourth reference voltage. The seventh switch is coupled between the seventh node and the ninth node. The eighth switch is coupled between the eighth node and the tenth node.

The technical means embodied in the embodiments of the present invention can solve at least one of the problems of the prior art. Therefore, compared to the prior art, the present invention can improve the performance of the dynamic amplifier.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be interpreted accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes an amplifier circuit. On account of that some or all elements of the amplifier circuit could be known, the detail of such elements is omitted provided that such detail has little to do with the features of this disclosure, and that this omission nowhere dissatisfies the specification and enablement requirements. A person having ordinary skill in the art can choose components or steps equivalent to those described in this specification to carry out the present invention, which means that the scope of this invention is not limited to the embodiments in the specification.

Figure 1:
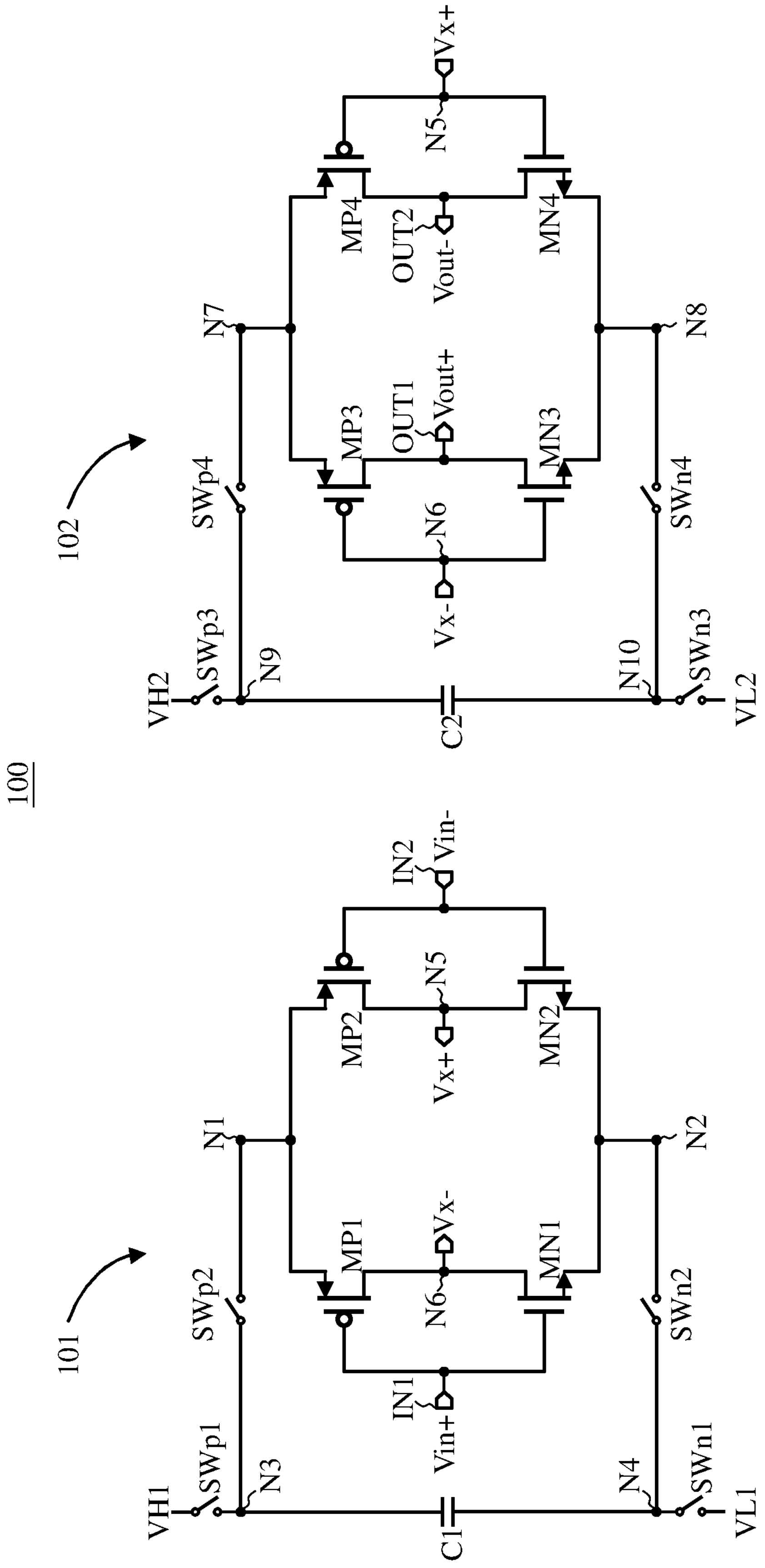
FIG. 1 is a circuit diagram of an amplifier circuit according to an embodiment of the present invention.

FIG. 1 is a circuit diagram of an amplifier circuit according to an embodiment of the present invention. The amplifier circuit 100 includes a dynamic amplifier 101 and a dynamic amplifier 102. The input terminal IN1 and the input terminal IN2 are the input terminals of the amplifier circuit 100, and the output terminal OUT1 and the output terminal OUT2 are the output terminals of the amplifier circuit 100.

It should be noted that in order to focus the discussion below on the technical features of this disclosure, FIG. 1 omits the load capacitors coupled to the node N5, the node N6, the output terminal OUT1, and the output terminal OUT2. As people having ordinary skill in the art are familiar with the purpose of load capacitors, further explanation is omitted for brevity. It should be noted that the node N5 and the node N6 may not be coupled with a load capacitor.

The dynamic amplifier 101 has an input terminal IN1, an input terminal IN2, a node N1, a node N2, a node N3, a node N4, a node N5, and a node N6, and includes a transistor MP1, a transistor MN1, a transistor MP2, a transistor MN2, a capacitor C1, a switch SWp1, a switch SWn1, a switch SWp2, and a switch SWn2.

The dynamic amplifier 101 amplifies the input voltage Vin+ and the input voltage Vin− (inputted to the dynamic amplifier 101 through the input terminal IN1 and the input terminal IN2 respectively) to generate the intermediate voltage Vx+ (namely, the voltage at the node N5) and the intermediate voltage Vx− (namely, the voltage at the node N6). The input voltage Vin+ and the input voltage Vin− are a pair of differential signals. The intermediate voltage Vx+ and the intermediate voltage Vx− are a pair of differential signals. The intermediate voltage Vx+ and the intermediate voltage Vx− are signals generated by amplifying the input voltage Vin+ and the input voltage Vin-using the dynamic amplifier 101.

The transistor MP1 is a P-channel Metal-Oxide-Semiconductor Field-Effect Transistor (hereinafter referred to as PMOS transistor). The source of the transistor MP1 is coupled or electrically connected to the node N1; the drain of the transistor MP1 is coupled or electrically connected to the node N6; the gate (control terminal) of the transistor MP1 is coupled or electrically connected to the input terminal IN1.

The transistor MN1 is an N-channel Metal-Oxide-Semiconductor Field-Effect Transistor (hereinafter referred to as NMOS transistor). The source of the transistor MN1 is coupled or electrically connected to the node N2; the drain of the transistor MN1 is coupled or electrically connected to the node N6; the gate of the transistor MN1 is coupled or electrically connected to the input terminal IN1.

The transistor MP2 is a PMOS transistor. The source of the transistor MP2 is coupled or electrically connected to the node N1; the drain of the transistor MP2 is coupled or electrically connected to the node N5; the gate of the transistor MP2 is coupled or electrically connected to the input terminal IN2.

The transistor MN2 is an NMOS transistor. The source of the transistor MN2 is coupled or electrically connected to the node N2; the drain of the transistor MN2 is coupled or electrically connected to the node N5; the gate of the transistor MN2 is coupled or electrically connected to the input terminal IN2.

One terminal of the switch SWp1 is coupled to the reference voltage VH1 (i.e., the switch SWp1 receives the reference voltage VH1); another terminal of the switch SWp1 is coupled or electrically connected to the node N3 (i.e., one terminal of the capacitor C1).

One terminal of the switch SWn1 is coupled to the reference voltage VL1 (i.e., the switch SWn1 receives the reference voltage VL1); another terminal of the switch SWn1 is coupled or electrically connected to the node N4 (i.e., the other terminal of the capacitor C1).

One terminal of the switch SWp2 is coupled or electrically connected to the node N1; another terminal of the switch SWp2 is coupled or electrically connected to the node N3.

One terminal of the switch SWn2 is coupled or electrically connected to the node N2; another terminal of the switch SWn2 is coupled or electrically connected to the node N4.

The dynamic amplifier 102 has an output terminal OUT1, an output terminal OUT2, a node N5, a node N6, a node N7, a node N8, a node N9, and a node N10, and includes a transistor MP3, a transistor MN3, a transistor MP4, a transistor MN4, a capacitor C2, a switch SWp3, a switch SWn3, a switch SWp4, and a switch SWn4.

The dynamic amplifier 102 amplifies the intermediate voltage Vx+ and the intermediate voltage Vx− (inputted to the dynamic amplifier 102 through the node N5 and the node N6 respectively) to generate the output voltage Vout+ and the output voltage Vout− (outputted through the output terminal OUT1 and the output terminal OUT2 respectively). The output voltage Vout+ and output voltage Vout− are a pair of differential signals. The output voltage Vout+ and output voltage Vout− are signals generated by amplifying the intermediate voltage Vx+ and the intermediate voltage Vx− using the dynamic amplifier 102.

The transistor MP3 is a PMOS transistor. The source of the transistor MP3 is coupled or electrically connected to the node N7; the drain of the transistor MP3 is coupled or electrically connected to the output terminal OUT1; the gate of the transistor MP1 is coupled or electrically connected to the node N6.

The transistor MN3 is an NMOS transistor. The source of the transistor MN3 is coupled or electrically connected to the node N8; the drain of the transistor MN3 is coupled or electrically connected to the output terminal OUT1; the gate of the transistor MN3 is coupled or electrically connected to the node N6.

The transistor MP4 is a PMOS transistor. The source of the transistor MP4 is coupled or electrically connected to the node N7; the drain of the transistor MP4 is coupled or electrically connected to the output terminal OUT2; the gate of the transistor MP4 is coupled or electrically connected to the node N5.

The transistor MN4 is an NMOS transistor. The source of the transistor MN4 is coupled or electrically connected to the node N8; the drain of the transistor MN4 is coupled or electrically connected to the output terminal OUT2; the gate of the transistor MN4 is coupled or electrically connected to the node N5.

One terminal of the switch SWp3 is coupled to the reference voltage VH2 (i.e., the switch SWp3 receives the reference voltage VH2); another terminal of the switch SWp3 is coupled or electrically connected to the node N9 (i.e., one terminal of the capacitor C2).

One terminal of the switch SWn3 is coupled to the reference voltage VL2 (i.e., the switch SWn3 receives the reference voltage VL2); another terminal of the switch SWn3 is coupled or electrically connected to the node N10 (i.e., the other terminal of the capacitor C2).

One terminal of the switch SWp4 is coupled or electrically connected to the node N7; another terminal of the switch SWp4 is coupled or electrically connected to the node N9.

One terminal of the switch SWn4 is coupled or electrically connected to the node N8; another terminal of the switch SWn4 is coupled or electrically connected to the node N10.

Figure 2:
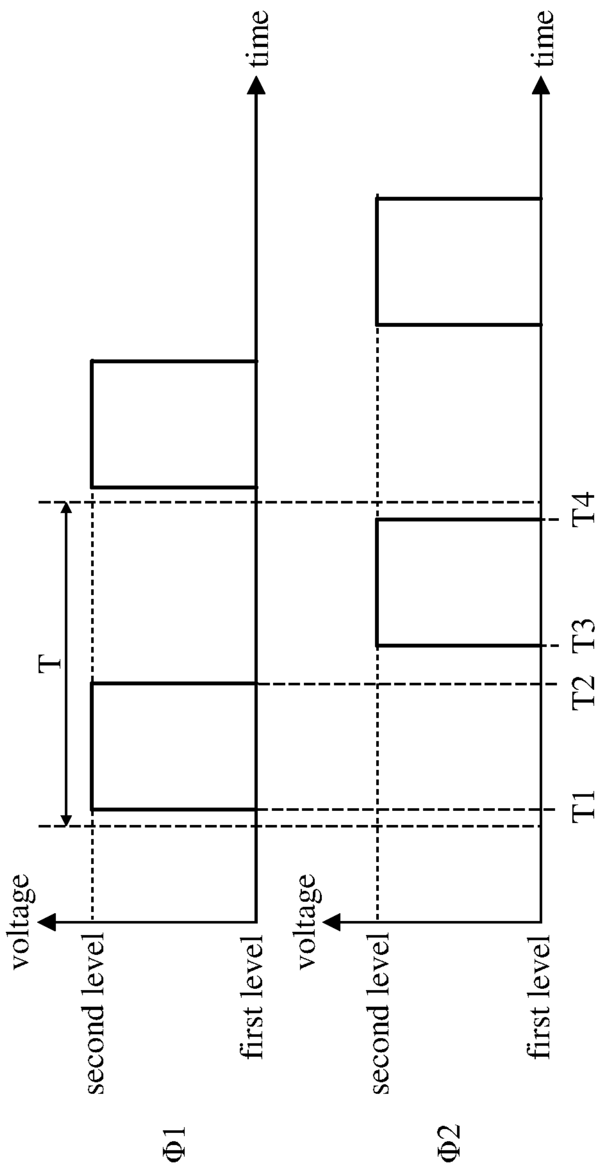
FIG. 2 shows waveforms for multiple clocks according to an embodiment of the present invention.

FIG. 2 shows waveforms of multiple clocks according to an embodiment of the present invention. The amplifier circuit 100 operates according to the clocks of FIG. 2. When the clock Φ1 is at the first level (low in FIG. 2's example, though not limited to this), the switch SWp1 and the switch SWn1 are turned on, and the switch SWp2 and the switch SWn2 are turned off. When the clock Φ1 is at the second level (high in FIG. 2's example, though not limited to this), the switch SWp1 and the switch SWn1 are turned off, and the switch SWp2 and the switch SWn2 are turned on. When the clock Φ2 is at the first level, the switch SWp3 and the switch SWn3 are turned on, and the switch SWp4 and the switch SWn4 are turned off. When the clock Φ2 is at the second level, the switch SWp3 and the switch SWn3 are turned off, and the switch SWp4 and the switch SWn4 are turned on.

When the clock Φ1 is at the first level, the dynamic amplifier 101 is reset (which includes, but is not limited to, resetting the terminal voltages of the transistor MP1, the transistor MN1, the transistor MP2, the transistor MN2, and the load capacitor (if any)), and when the clock Φ2 is at the first level, the dynamic amplifier 102 is reset (which includes, but is not limited to, resetting the terminal voltages of the transistor MP3, the transistor MN3, the transistor MP4, the transistor MN4, and the load capacitor). For brevity, the operational details of resetting transistors and load capacitors are omitted, as they are well known to people having ordinary skill in the art.

The clock Φ1 and the clock Φ2 are non-overlapping, meaning they are not at the high level or the low level at the same time. For instance, in FIG. 2, the clock Φ1 and the clock Φ2 are not at the high level at the same time.

The amplifier circuit 100 has a relatively large gain because the input voltage Vin+ and the input voltage Vin- undergo double amplification in a single amplification operation (which corresponds to one cycle T) of the amplifier circuit 100. Specifically, in one amplification operation, the dynamic amplifier 101 performs the first amplification when the clock Ø1 is at the second level (e.g., between the time point T1 and the time point T2 in FIG. 2), and subsequently, the dynamic amplifier 102 performs the second amplification when the clock Φ2 is at the second level (e.g., between the time point T3 and the time point T4 in FIG. 2). If the gain of the dynamic amplifier 101 is A1, and the gain of the dynamic amplifier 102 is A2, the overall gain (or equivalent gain) of the amplifier circuit 100 is A1*A2.

In some embodiments, the gain A1 is equal to the gain A2. In other embodiments, the gain A1 is not equal to the gain A2.

Because the gain A1 of the dynamic amplifier 101 is proportional to the amount of charge on the capacitor C1 (the higher the amount of charge, the greater the gain), and the gain A2 of the dynamic amplifier 102 is proportional to the amount of charge on the capacitor C2, the gain A1 and the gain A2 can be adjusted using the following techniques: (1) adjusting the capacitance value of the capacitor C1 and the capacitance value of the capacitor C2; (2) adjusting the reference voltage VH1, the reference voltage VL1, the reference voltage VH2, and the reference voltage VL2; and/or (3) adjusting the duration during which the clock Φ1 is at the second level (i.e., T2-T1) and the duration during which the clock Φ2 is at the second level (i.e., T4-T3). That is, the circuit designer has considerable flexibility in determining the gain of the amplifier circuit 100.

In some embodiments, the capacitance value of the capacitor C1 may or may not be equal to the capacitance value of the capacitor C2.

In some embodiments, the difference between the reference voltage VH1 and the reference voltage VL1 may or may not be equal to the difference between the reference voltage VH2 and the reference voltage VL2. For example, the reference voltage VH1 may or may not be equal to the reference voltage VH2. For example, the reference voltage VL1 may or may not be equal to the reference voltage VL2.

In some embodiments, the duration during which the clock 1 is at the second level (i.e., T2-T1) may or may not be equal to the duration during which the clock Φ2 is at the second level (i.e., T4-T3).

The design of the amplifier circuit 100 facilitates the application of the amplifier circuit 100 in multiple voltage domains, thereby improving the practicality of the amplifier circuit 100. More specifically, the voltage domain of the dynamic amplifier 101 may be a high (low)-voltage domain, while the voltage domain of the dynamic amplifier 102 may be a low (high)-voltage domain.

As an example, the dynamic amplifier 101 operates in the high-voltage domain and the dynamic amplifier 102 operates in the low-voltage domain. When the range of the input voltage Vin+ and the input voltage Vin− is large (or the common-mode voltage of the two is large), the dynamic amplifier 101 may operate in the high-voltage domain; in this context, the transistor MP1, the transistor MN1, the transistor MP2, and the transistor MN2 may be high-voltage (e.g., 1.8 V or 3.3 V) components. In cases where the load to be driven by the dynamic amplifier 102 is relatively heavy, the dynamic amplifier 102 requires a higher operating speed and a higher driving capability; in this context, the dynamic amplifier 102 may operate in the low-voltage domain (the transistor MP3, the transistor MN3, the transistor MP4, and the transistor MN4 can be low-voltage (e.g., 0.5 V or 1 V) components).

In other embodiments, the dynamic amplifier 101 operates in the low-voltage domain (the transistors MP1, MN1, MP2, and MN2 may be low-voltage components), and the dynamic amplifier 102 operates in the high-voltage domain (the transistors MP3, MN3, MP4, and MN4 may be high-voltage components).

When the dynamic amplifier 101 operates in the high-voltage domain and the dynamic amplifier 102 operates in the low-voltage domain, the reference voltage VH1 may be designed to be greater than the reference voltage VH2. When the dynamic amplifier 101 operates in the low-voltage domain and the dynamic amplifier 102 operates in the high-voltage domain, the reference voltage VH1 may be designed to be smaller than the reference voltage VH2.

In other embodiments, the dynamic amplifier 101 and the dynamic amplifier 102 may operate in the same voltage domain, and all transistors of the amplifier circuit 100 are of the same type (i.e., all of which are high-voltage components or low-voltage components).

In other embodiments, the reference voltage VH1 is different from the reference voltage VH2 and the reference voltage VL1 is different from the reference voltage VL2, but all of the transistors of the amplifier circuit 100 are of the same type.

In an alternative embodiment, the reference voltage VH1 is equal to the reference voltage VH2, and the reference voltage VL1 is equal to the reference voltage VL2.

Note that the shape, size, and ratio of any element in the disclosed figures are exemplary for understanding, not for limiting the scope of this invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. An amplifier circuit having a first input terminal, a second input terminal, a first output terminal, a second output terminal, a first node, a second node, a third node, a fourth node, a fifth node, a sixth node, a seventh node, an eighth node, a ninth node, and a tenth node, the amplifier circuit comprising:

a first dynamic amplifier, comprising:

a first transistor having a first terminal, a second terminal, and a first control terminal, wherein the first terminal is coupled to the first node, the second terminal is coupled to the sixth node, and the first control terminal is coupled to the first input terminal;

a second transistor having a third terminal, a fourth terminal, and a second control terminal, wherein the third terminal is coupled to the second node, the fourth terminal is coupled to the sixth node, and the second control terminal is coupled to the first input terminal;

a third transistor having a fifth terminal, a sixth terminal, and a third control terminal, wherein the fifth terminal is coupled to the first node, the sixth terminal is coupled to the fifth node, and the third control terminal is coupled to the second input terminal;

a fourth transistor having a seventh terminal, an eighth terminal, and a fourth control terminal, wherein the seventh terminal is coupled to the second node, the eighth terminal is coupled to the fifth node, and the fourth control terminal is coupled to the second input terminal;

a first capacitor having a ninth terminal and a tenth terminal, wherein the ninth terminal is coupled to the third node, and the tenth terminal is coupled to the fourth node;

a first switch coupled between the third node and a first reference voltage;

a second switch coupled between the fourth node and a second reference voltage;

a third switch coupled between the first node and the third node; and a fourth switch coupled between the second node and the fourth node; and a second dynamic amplifier, comprising:

a fifth transistor having an eleventh terminal, a twelfth terminal, and a fifth control terminal, wherein the eleventh terminal is coupled to the seventh node, the twelfth terminal is coupled to the first output terminal, and the fifth control terminal is coupled to the sixth node;

a sixth transistor having a thirteenth terminal, a fourteenth terminal, and a sixth control terminal, wherein the thirteenth terminal is coupled to the eighth node, the fourteenth terminal is coupled to the first output terminal, and the sixth control terminal is coupled to the sixth node;

a seventh transistor having a fifteenth terminal, a sixteenth terminal, and a seventh control terminal, wherein the fifteenth terminal is coupled to the seventh node, the sixteenth terminal is coupled to the second output terminal, and the seventh control terminal is coupled to the fifth node;

an eighth transistor having a seventeenth terminal, an eighteenth terminal, and an eighth control terminal, wherein the seventeenth terminal is coupled to the eighth node, the eighteenth terminal is coupled to the second output terminal, and the eighth control terminal is coupled to the fifth node;

a second capacitor having a nineteenth terminal and a twentieth terminal, wherein the nineteenth terminal is coupled to the ninth node, and the twentieth terminal is coupled to the tenth node;

a fifth switch coupled between the ninth node and a third reference voltage;

a sixth switch coupled between the tenth node and a fourth reference voltage;

a seventh switch coupled between the seventh node and the ninth node; and an eighth switch coupled between the eighth node and the tenth node.

2. The amplifier circuit of claim 1, wherein the first switch, the second switch, the third switch, the fourth switch, the fifth switch, the sixth switch, the seventh switch, and the eighth switch operate according to a first clock and a second clock, and the first clock and the second clock are not at a second level at the same time; when the first clock is at a first level, the first switch and the second switch are turned on, and the third switch and the fourth switch are turned off; when the first clock is at the second level, the first switch and the second switch are turned off, and the third switch and the fourth switch are turned on; when the second clock is at the first level, the fifth switch and the sixth switch are turned on, and the seventh switch and the eighth switch are turned off; when the second clock is at the second level, the fifth switch and the sixth switch are turned off, and the seventh switch and the eighth switch are turned on.

3. The amplifier circuit of claim 2, wherein a duration during which the first clock is at the second level equals a duration during which the second clock is at the second level.

4. The amplifier circuit of claim 1, wherein a difference between the first reference voltage and the second reference voltage equals a difference between the third reference voltage and the fourth reference voltage.

5. The amplifier circuit of claim 1, wherein a capacitance value of the first capacitor equals a capacitance value of the second capacitor.

6. The amplifier circuit of claim 1, wherein the first reference voltage equals the third reference voltage.

7. The amplifier circuit of claim 1, wherein the second reference voltage equals the fourth reference voltage.

8. The amplifier circuit of claim 1, wherein the first reference voltage equals the third reference voltage, and the second reference voltage equals the fourth reference voltage.

9. The amplifier circuit of claim 1, wherein the first dynamic amplifier has a first gain, the second dynamic amplifier has a second gain, and the first gain is different from the second gain.

10. The amplifier circuit of claim 1, wherein the first dynamic amplifier operates in a first voltage domain, the second dynamic amplifier operates in a second voltage domain, and the first voltage domain is different from the second voltage domain.

11. The amplifier circuit of claim 1, wherein the first transistor, the second transistor, the third transistor, and the fourth transistor are high-voltage components, and the fifth transistor, the sixth transistor, the seventh transistor, and the eighth transistor are low-voltage components.

12. The amplifier circuit of claim 1, wherein the first transistor, the second transistor, the third transistor, and the fourth transistor are low-voltage components, and the fifth transistor, the sixth transistor, the seventh transistor, and the eighth transistor are high-voltage components.

* * * * *